US008147253B2

(12) United States Patent
Goodman et al.

(10) Patent No.: US 8,147,253 B2
(45) Date of Patent: Apr. 3, 2012

(54) SPLIT RING TERMINAL ASSEMBLY

(75) Inventors: Glenn Goodman, Cumberland, RI (US); Michael Murphy, East Greenwich, RI (US)

(73) Assignee: Advanced Interconnections Corp., West Warwick, RI (US)

( * ) Notice: Subject to any disclaimer, the term of this patent is extended or adjusted under 35 U.S.C. 154(b) by 0 days.

(21) Appl. No.: 12/826,942

(22) Filed: Jun. 30, 2010

(65) Prior Publication Data

US 2012/0003845 A1 Jan. 5, 2012

(51) Int. Cl.
*H01R 12/00* (2006.01)
*H05K 1/00* (2006.01)

(52) U.S. Cl. .......................................................... 439/66

(58) Field of Classification Search .................. 439/700, 439/73, 824, 66, 65, 71, 70, 74
See application file for complete search history.

(56) References Cited

U.S. PATENT DOCUMENTS

| | | | | |
|---|---|---|---|---|
| 4,775,335 | A | 10/1988 | Havel | 439/820 |
| 4,838,801 | A | 6/1989 | Bertoglio et al. | 439/83 |
| 5,151,040 | A | 9/1992 | Tanaka | 439/73 |
| 5,215,472 | A | 6/1993 | DelPrete et al. | 439/71 |
| 5,702,255 | A | 12/1997 | Murphy | |
| 6,416,331 | B1 | 7/2002 | Shimizu | |
| 7,435,102 | B2 * | 10/2008 | Goodman | 439/70 |
| 2004/0106327 | A1 | 6/2004 | Baker | |
| 2007/0167038 | A1 * | 7/2007 | Goodman | 439/70 |
| 2009/0004929 | A1 | 1/2009 | Kainz | |

* cited by examiner

*Primary Examiner* — Javaid Nasri
(74) *Attorney, Agent, or Firm* — Occhiuti Rohlicek & Tsao LLP

(57) ABSTRACT

A connector assembly configured to electrically connect a first substrate with a second substrate is provided. The connector assembly includes an insulating support member including an array of apertures, and terminal assemblies disposed in the apertures. Each terminal assembly includes a hollow cylindrical body, and first and second terminals disposed on opposed ends of the body. The body is split by an opening extending between opposed ends, and resiliency of the body biases the first and second terminals in opposed directions along the longitudinal axis.

17 Claims, 11 Drawing Sheets

SPLIT RING TERMINAL ASSEMBLY

BACKGROUND OF THE INVENTION

Ball grid array (BGA) and land grid array (LGA) integrated circuit (IC) packages are becoming increasingly popular. With a BGA package, for example, the rounded solder balls of the BGA are generally soldered directly to corresponding surface mount pads of a printed circuit board rather than to plated thru-holes which receive pins from, for example, a pin grid array (PGA) package. BGA packages are advantageous due to the ability to provide a high density of connections and low profiles. In addition, BGAs, with their very short distance between the package and the printed circuit board, have low inductances and therefore have far superior electrical performance relative to leaded devices. Once soldered to a printed circuit board, however, BGAs are difficult to replace or interchange.

Intercoupling components (e.g., adaptors, sockets and connector assemblies) are used to allow particular IC packages to be reliably interchanged without permanent connection to a printed circuit board. More recently, adaptors for use with BGA and LGA packages have been developed to allow these packages to be non-permanently connected (e.g., for testing) to a printed circuit board.

SUMMARY

In some aspects, a connector assembly is provided that is configured to electrically connect a first substrate with a second substrate. The connector assembly includes an insulating support member including an array of apertures. Each aperture extends from a first surface of the insulating support member to an opposite second surface of the insulating support member. Each aperture is configured to receive a terminal assembly. The connector assembly also includes terminal assemblies which provide electrical connections between connection regions of the first substrate and respective corresponding connection regions of the second substrate. A terminal assembly is disposed in at least one of the apertures. Each terminal assembly includes a hollow cylindrical body, the body including a first end, a second end opposed to the first end, and a longitudinal axis, the body configured to be radially resilient. Each terminal assembly also includes a first terminal disposed on the first end of the body and configured to be longitudinally movable relative to the first end, and a second terminal disposed on the second end of the body and configured to be longitudinally movable relative to the second end. The resiliency of the body biases the first and second terminals in opposed directions along the longitudinal axis.

In some aspects, terminal assembly is provided. The terminal assembly includes a hollow cylindrical body. The body includes a first end, a second end opposed to the first end, and a longitudinal axis, and is configured to be radially resilient. The terminal assembly also includes a first terminal disposed on the first end of the body and configured to be longitudinally movable relative to the first end, and a second terminal disposed on the second end of the body and configured to be longitudinally movable relative to the second end. The resiliency of the body biases the first and second terminals in opposed directions along the longitudinal axis.

The connector and terminal assemblies may include one or more of the following features: The body includes an opening that extends from the first end to the second end. The body has a C-shaped cross section as viewed in a direction along the longitudinal axis. The body includes a sidewall having a thickness which decreases adjacent to each of the first and second ends. The connector assembly may further include a first operating configuration in which the body has a first body diameter and a second operating configuration in which the body has a second body diameter, wherein the second body diameter is greater than the first body diameter. The first and second terminals are received within the body such that sidewalls of the first and second terminals have an electrical connection with an interior surface of the body. The body includes a tapered edge at the intersection of the interior surface of the body and each of the first and second ends, and each of the first and second terminals include a tapered portion configured to mate with the corresponding tapered edge of the body, whereby the first and second terminal are axially slidable relative to the body along the respective tapered mating surfaces. Each of the first and second terminals include a first portion configured to contact an electrical connection region of a substrate, and a second portion extending from the first portion and having a decreasing outer diameter. The body is received within each of the first and second terminals such that sidewalls of the body contact an interior surface of each of the first and second terminals. The body includes a tapered edge at the intersection of the exterior surface of the body and each of the first and second ends, and each of the first and second terminals include a tapered portion configured to mate with the corresponding tapered edge of the body, whereby the first and second terminal are axially slidable relative to the body along the respective tapered mating surfaces. Each of the first and second terminals include a first portion configured to contact an electrical connection region of a substrate, and a second portion extending from the first portion and having an increasing inner diameter. Each of the first and second terminals include a hollow cylindrical body.

The connector assembly may include one or more of the following additional features: Each aperture includes a first diameter portion and a second diameter portion that is less than the first diameter portion, the body is disposed in the first diameter portion. Each of the first and second terminals include a first terminal portion, a second terminal portion, and a protrusion. The first terminal portion has a first terminal diameter and configured to contact an electrical connection region of a substrate. The second terminal portion extends from the first terminal portion and has a second terminal diameter that is greater than the first terminal diameter, the second terminal diameter decreasing along an axial direction away from the first terminal portion. In addition, the protrusion is disposed at the location corresponding to the transition between the first and second terminal portions, the diameter of the protrusion being greater than the second diameter portion of the aperture, whereby at least some of the respective terminal is maintained within the first diameter portion. The protrusion is a flange.

The terminal assembly may include one or more of the following additional features: The body, the first terminal and the second terminal include an electrically conductive material. The first and second terminals are configured to be mutually aligning.

The connector assembly includes terminals that are very low profile. For example, the terminals are 0.030 inches or less in height, where terminal height corresponds to terminal axial length. In addition, the connector assembly can achieve a 0.5 mm pitch, whereby increased terminal density can be achieved.

In addition, for some applications, the connector assembly including the very low profile terminals (0.030 inches or less) can operate at a high frequency rate. In particular, the relatively shorter terminal axial length corresponds to a shorter electrical path between opposed terminal ends. In addition, geometry changes through the terminal have less time to resolve electrically, and thus have less effect on electrical performance. As a result, higher frequency operation can be achieved.

DETAILED DESCRIPTION

Figure 1:
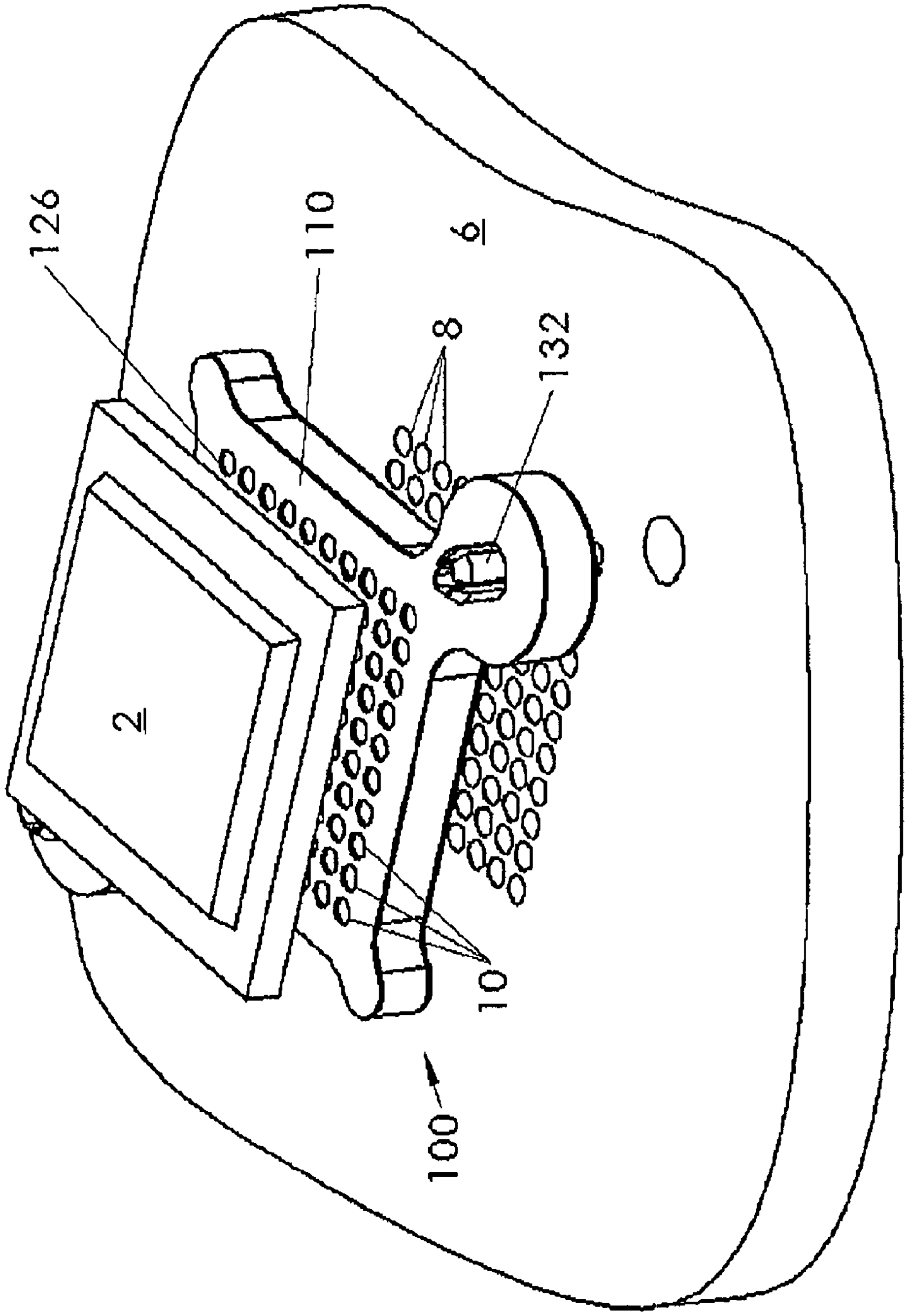
FIG. 1 is a perspective view of a connector assembly connecting a BGA package to a printed circuit board.

Referring to FIG. 1, a connector assembly 100 for intercoupling a BGA integrated circuit package 2 to a printed circuit board 6 is shown. The connector assembly 100, serving as an intercoupling component, includes multiple low profile terminal assemblies 10 supported in an insulative support member 110. Each terminal assembly 10 is received within a corresponding one of an array of holes 126 in the insulative support member 110. The array of holes 126 are provided in a pattern corresponding to a footprint of rounded solder balls (not shown) of BGA package 2 as well as a footprint of surface mount pads 8 of the printed circuit board 6.

When the solder balls of the BGA package 2 are in contact with the terminals of the corresponding terminals assemblies 10, the BGA package 2 is converted to a high density pin grid array (PGA). When the connector assembly 100 is assembled with the printed circuit board 6, the opposed terminals of the terminal assemblies 10 provide an identical mating condition to the surface mount pads 8 of the printed circuit board 6 as would have been the case if the BGA package 2 had been connected directly to the circuit board. Thus, the connector assembly 100 permits the BGA package 2 to be non-permanently electrically intercoupled with the printed circuit board 6. In some embodiments, the insulative support member 110 is secured to the printed circuit board 6, for example using a fastener 132, so that the terminal assemblies 10 are aligned and in electrical contact with corresponding surface mount pads 8. Then the BGA package 2 is secured to the insulative support member 110 so that the solder balls are aligned and in electrical contact with corresponding terminal assemblies 10, for example using a clamping member (not shown) to provide the PGA. In other embodiments, the BGA package 2 and connector assembly 100 are assembled and then secured to the printed circuit board 6, for example using a clamping member (not shown) to provide the same PGA.

Figure 2:
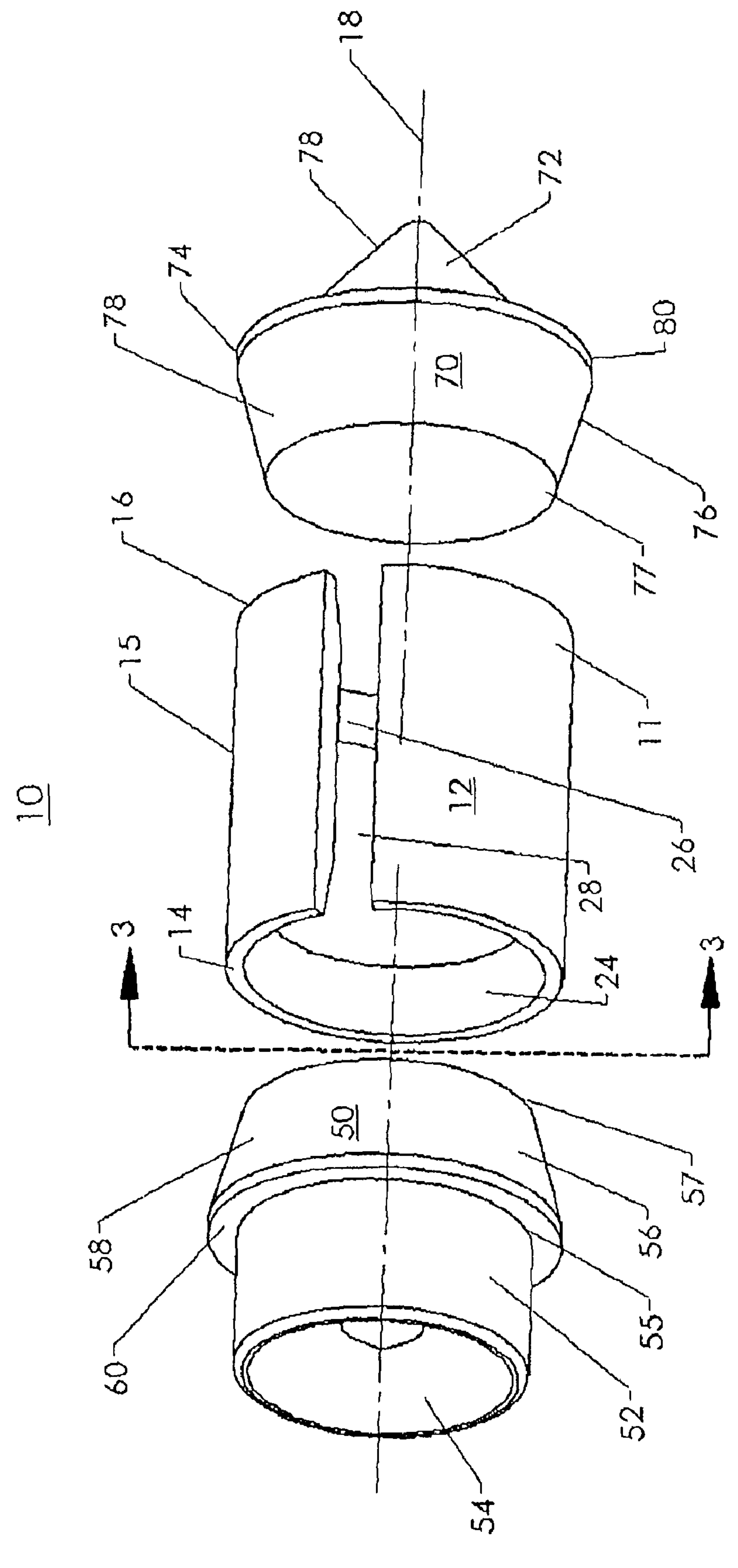
FIG. 2 is an exploded view of a terminal assembly.

Referring to FIG. 2, each terminal assembly 10 includes a resilient body 12 having a first terminal 50 disposed on the first end 14 of the body 12, and a second terminal 70 disposed on the second end 16. The first and second terminals 50, 70 are configured to be longitudinally movable relative to the respective ends 14, 16, as discussed further below. In addition, the resiliency of the body 12 biases the first and second terminals 50, 70 in opposed directions along the longitudinal axis 18.

Figure 3:
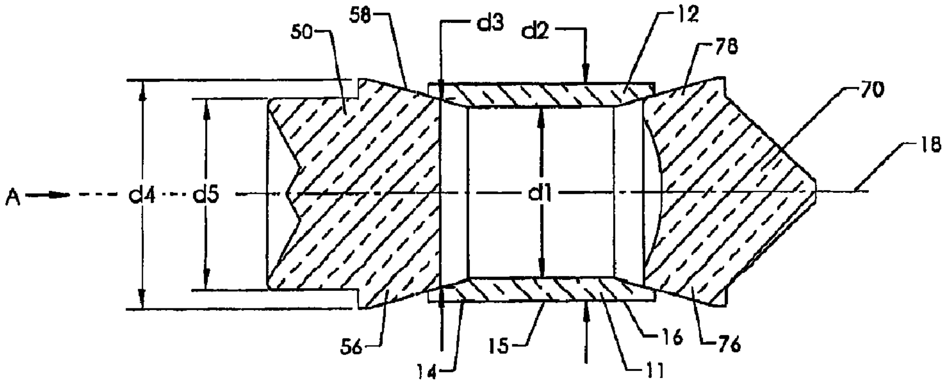
FIG. 3 is a side sectional view of the terminal assembly of FIG. 2.
Figure 4:
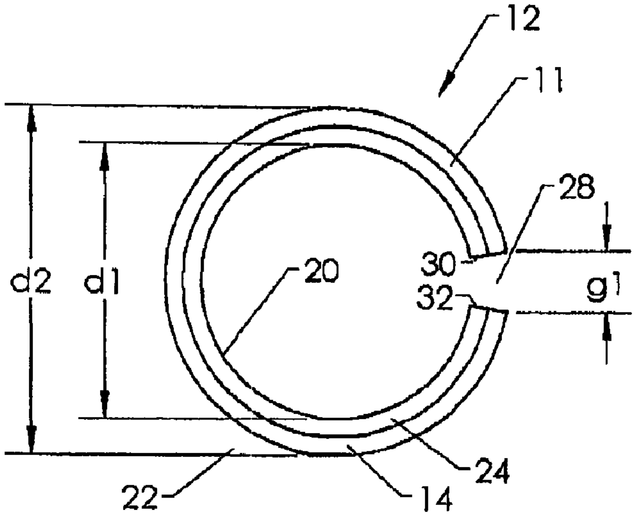
FIG. 4 is an end view of the body of the terminal assembly of FIG. 2 in an uncompressed state.

Referring also to FIGS. 3 and 4, the body 12 is a hollow cylinder and includes a sidewall 11 which defines an open first end 14, and an open second end 16 opposed to the first end 14. A longitudinal axis 18 extends between the opposed first and second ends 14, 16. The body 12 is split by an opening 28 that extends from the first end 14 to the second end 16 such that the body 12 has a C-shaped cross section as viewed in a direction along the longitudinal axis 18. The opening 28 extends through the thickness of the sidewall 11 from an inner surface 20 to an outer surface 22 of the body 12, and permits the body 12 to radially expand or contract when in certain loading conditions, as discussed further below. The opening 28 defines a gap g1 in the sidewall 11 between opposed edges 30, 32 of the opening 28.

The body 12 has a uniform outer diameter d2, and the inner surface 20 of the body 12 is tapered adjacent to each of the first and second ends 14, 16. In particular, the thickness of the sidewall 11 decreases in the tapered regions 24, 26 adjacent the first and second ends 14, 16 relative to the sidewall thickness in a mid portion 15 of the body 12. For example, the inner surface 20 of the body 12 may be angled in the tapered regions 24, 26 so as to taper toward the outer surface 22. When no external axial forces are applied to the first and second terminals 50, 70, the body 12 has an inner diameter d1 at the mid portion 15, for example in the region between tapered regions 24, 26. In the tapered regions 24, 26, the diameter tapers from d1 to a value less than d2.

Referring again to FIG. 2, the first terminal 50 includes a cylindrical first portion 52 configured to electrically connect to a solder ball 4 of the BGA 2. In particular, an end 54 of the first portion 52 is concave in shape and dimensioned to receive and form an electrical connection with a solder ball 4 of the BGA 2.

The first terminal 50 also includes a tapered second portion 56 configured to electrically connect to the tapered region 24 on the inner surface 20 of the body 12. The second portion 56 extends from a second end 55 of the first portion 52. The second portion 56 has a larger diameter than the first portion 52, whereby a shoulder 60 is formed at the second end 55 of the first portion 52. The second portion 56 is tapered in the longitudinal direction so as to gradually decrease in diameter from the shoulder 60 to the end 57 of the second portion 56, providing a tapered region 58 on the first terminal 50.

The second terminal 70 includes a first portion 72 shaped and dimensioned to electrically connect to a contact pad 8 of the PCB 6. In the illustrated embodiment the first portion 72 is generally conical in shape.

The second terminal 70 also includes a tapered second portion 76 configured to electrically connect to the tapered region 26 on the inner surface 20 of the body 12. The second portion 76 extends from one end 74 of the first portion 72. The second portion 76 has a larger diameter than the first portion 72, whereby a shoulder 80 is formed at the end 74 of the first portion 72. The second portion 76 is tapered in the longitudinal direction so as to gradually decrease in diameter from the shoulder 80 to the end 77 of the second portion 76, providing a tapered region 78 on the second terminal 70.

Referring again to FIG. 3, the second portions 56, 76 of the terminals 50, 70 are substantially the same size and shape. Each tapered region 58, 78 has a minimum diameter d3 at a location corresponding the respective terminal end 57, 77, and a maximum diameter d4 at a location corresponding to the respective shoulder 60, 80. The outer diameter of the cylindrical first portion 52 of the first terminal 50, and the maximum diameter of the conical first portion 72 of the second terminal 70 are substantially the same, and are referred to as d5.

When the terminal assembly 10 is assembled, the first terminal 50 is at least partially received within the open first end 14 of the body 12. In particular, the leading end 57 of the second portion 56 is received within the open first end 14 such that at least a portion of the tapered region 58 of the first terminal 50 contacts the tapered region 24 formed on the inner surface 20 of the body 12. Similarly, the second terminal 70 is at least partially received within the open second end 16 of the body 12 such that at least a portion of the tapered region 78 of the second terminal 70 contacts the tapered region 26 formed on the inner surface 20 of the body 12. The terminals 50, 70 form an electrical connection with the body 12 via the contact between the respective tapered regions.

When no external axial forces are applied to the first and second terminals 50, 70, the minimum diameter d3 of the second portion 56, 76 is greater than the inner diameter d1 of the body 12, and less than the outer diameter d2 of the body 12. In addition, the maximum diameter d4 of the second portion 56, 76 is greater than both the inner diameter d1 and the outer diameter d2 of the body 12.

Figure 6:
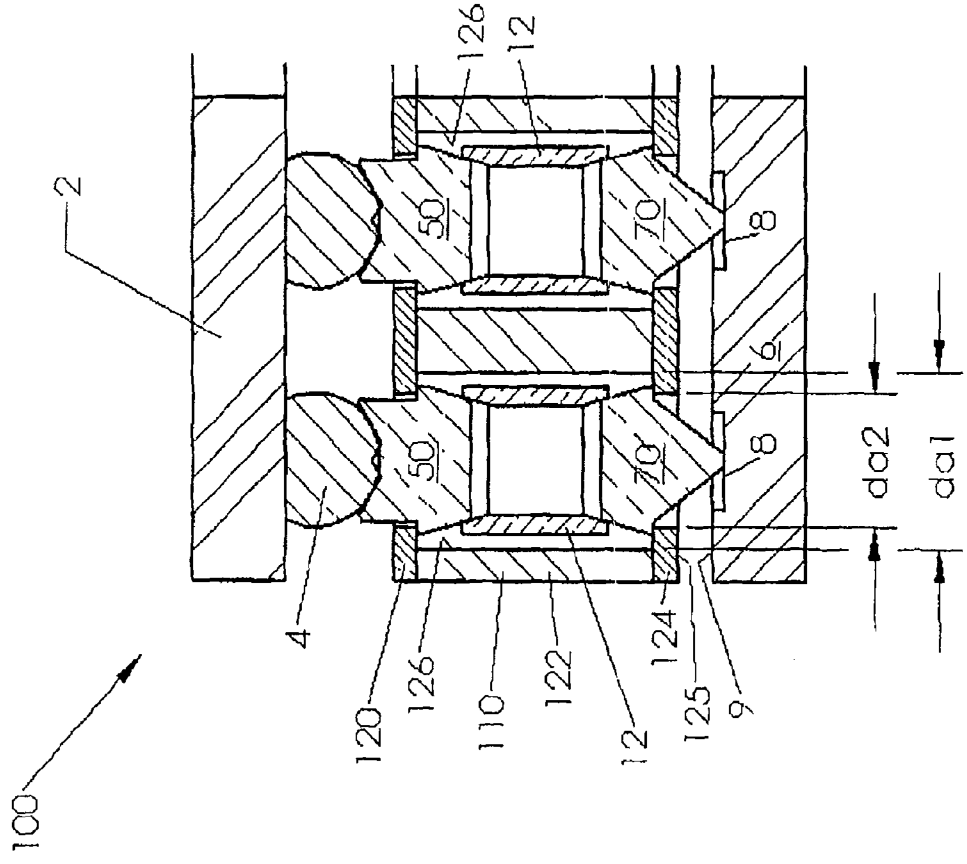
FIG. 6 is a sectional view of a connector assembly including the terminal assembly of FIG. 2 in an uncompressed state.

Referring to FIG. 6, the terminal assemblies 10 are received within the apertures 126 of the insulative support member 110 to form the connector assembly 100. The support member 110 is of three piece construction, and includes a relatively thick mid layer 122 that is covered on each side by a relatively thin cover layer 120, 124. In the illustrated embodiment, the three layers 120, 122, 124 of the support member 110 are formed of the same material, such as polyimide or Flame Retardant-4. However, the support member 110 is not limited to this, and one or more of the layers may be formed other electrically insulative materials.

The support member 110 includes the array of apertures 126 arranged in the pattern described above. Each aperture 126 passes through all layers 120, 122, 124 of the support member 110. The aperture 126 has a first aperture diameter da1 in the mid layer 122 that is greater than both the outer diameter d2 of the body 12, and the maximum diameter d4 of the second portion 56, 76 of the respective terminals 50, 70. The aperture 126 has a second aperture diameter da2 in each of the cover layers 120, 124 that is smaller than that of the first aperture diameter da1. In addition, the second aperture diameter da2 is greater than the outer diameter d5 of the first portion 52, 72 and less than the maximum diameter d4 of the second portion 56, 76 of the respective terminals 50, 70. In this configuration, the respective shoulders 60, 80 serve to retain the terminal assemblies 10 within the support member 110, while the first portions 52, 72 are allowed to protrude through the cover layers 120, 124. Here, it is understood that the terminal assembly 10 is floating within the aperture 126, and the connection between terminals 50, 70 and the body 12 is maintained by appropriately limiting the thickness of the mid layer 122.

When the connector assembly 100 is used to interconnect the BGA 2 and the PCB 6, an axially directed compressive load is applied to the terminals 50, 70. In particular, when the support member 110 is connected to the PCB 6, the outer surface 125 of the support member 110 contacts the surface 9 of the PCB. This proximity is sufficient to drive the second terminal 70 inward into the aperture 126. Here, the body 12 is sufficiently rigid to maintain the uncompressed configuration, including inner and outer diameters d1, d2, and the connector assembly 10 as a whole moves longitudinally within the aperture 126 in a direction away from the contact surface 9.

Figure 5:
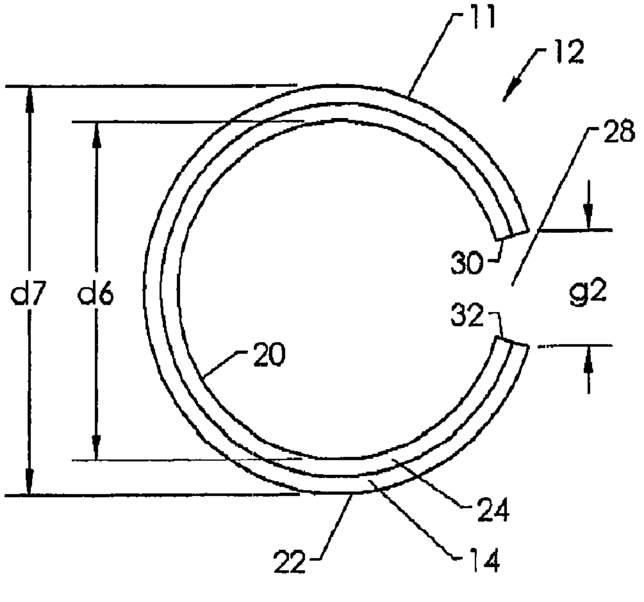
FIG. 5 is an end view of the body of the terminal assembly of FIG. 2 in a compressed state.
Figure 7:
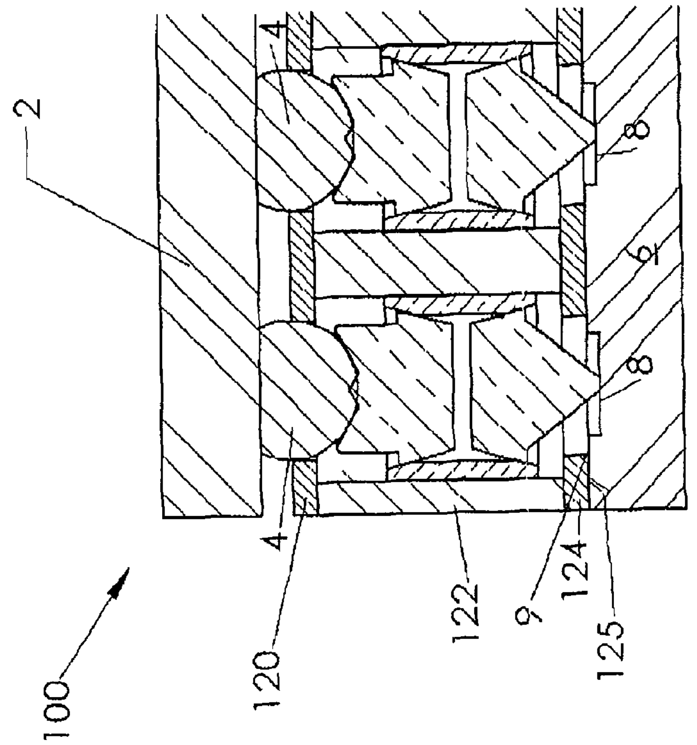
FIG. 7 is a sectional view of the connector assembly of FIG. 6 in a compressed state.

Referring now to FIG. 7, when the support member 110 is connected to the PCB 6 and the BGA 2 is connected to the opposed side of the support member 110, the proximity of the package 2 is sufficient to drive the first terminal 50 inward into the aperture 126 while the second terminal 70 is also moved inward into the aperture 126. Under these conditions, the body 12 resiliently radially expands since the terminals 50, 70 are moved toward each other along the longitudinal axis 18. In particular, the tapered region 58 of the first terminal 50 slides inward along the tapered region 24 formed on the inner surface 20 of the body 12. At the same time, the tapered region 78 of the second terminal 70 slides inward along the tapered region 26 formed on the inner surface 20 of the body 12. As the terminals 50, 70 move inward, each tapered region 58, 78 acts as a wedge to radially expand the body 12. In particular, the radial expansion of the body 12 is achieved due to the presence of the opening 28 in the sidewall 11. For example, with reference to FIG. 5, in the compressed configuration, the body 12 has an expanded inner diameter d6 and outer diameter d7 which are greater than the corresponding diameters d1, d2 of the uncompressed state. In addition, in the compressed configuration, the opening 28 defines a gap g2 in the sidewall 11 which is larger than the gap g1 of the uncompressed state.

The terminals 50, 70 continue to form an electrical connection with the body 12 via the contact between the respective tapered regions 58, 78 regardless of the longitudinal position of the terminals 50, 70 with respect to the body 12. In the compressed configuration, the second portions 56, 76 of each of the first and second terminals 50, 70 are fully received within interior space of the body 12. In addition, the expanded outer diameter d7 of the body 12 is less than that of the first aperture diameter da1 within the mid layer 122 (space between body 12 and aperture 126 not shown in the figure). Also, the second aperture diameter da2 corresponding to the cover layer 120 is greater than that of the solder ball 4, and in the compressed configuration at least a portion of the solder ball 4 may be disposed within the aperture 126.

The configuration shown in FIG. 7 is a very low profile configuration. In some embodiments, the connector assembly

100 is dimensioned to provide a spacing between the BGA 2 and PCB 6 of only about 0.027 inches for a pitch (i.e., spacing between apertures) of 0.5 mm. This can be compared to spacing in the uncompressed configuration of about 0.037 inches.

The body 12 and terminals 50, 70 are each formed of, or plated with, metal. The same metal, for example gold, may used for the body 12 and both terminals 50, 70, or one or more of these components may be formed of or plated with a unique metal. However, the body 12 and terminals are not limited to this material, and it is understood that any suitable electrically conductive material can be used to form these components.

It is understood that when the connector assembly is disconnected from one or both of the BGA 2 and PCB 6, the natural tendency of the body 12 to return to its unexpanded configuration serves as a spring force to urge the terminals 50, 70 to move apart along the longitudinal axis 18.

Figure 8:
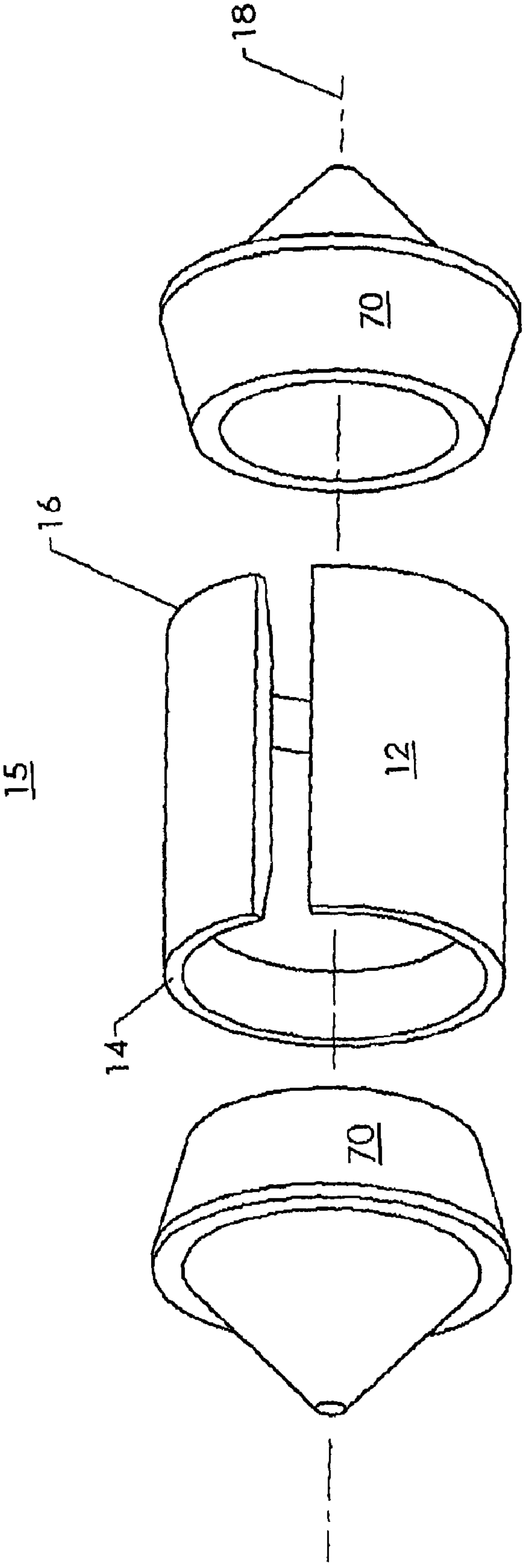
FIG. 8 is an exploded view of an alternative embodiment of a terminal assembly.

Referring to FIG. 8, the terminals 50, 70 of the terminal assembly 10 are interchangeable. For example, the first terminal 50 can be replaced with a second terminal 70, resulting in an alternative terminal assembly 15 that includes two second terminals 70. In this embodiment, one second terminal 70 is mounted on each open end 14, 16 of the body 12. Such a terminal assembly 15, when employed in a connector assembly 100, is useful to achieve interconnection of respective conductive pads 8 of two separate printed circuit boards 6, 6.

When the terminal assembly 10 is in an uncompressed configuration, the gap g1 of the body 12 has a dimension that ranges from approximately zero, in which the opposed edges 30, 32 are touching, to a non-zero value which may be as much as 0.25 times the circumference of the body 12. Here it is understood that the maximum expanded outer diameter d7 of the body 12 is limited by the inner diameter da1 of the aperture 126. In addition, the maximum inner diameter d6 of the body 12 is limited by the requirement that the respective tapered regions 24, 26 of the body 12 maintain an electrical connection with the tapered regions 58, 78 of the terminals regardless of terminal compression state.

Figure 9:
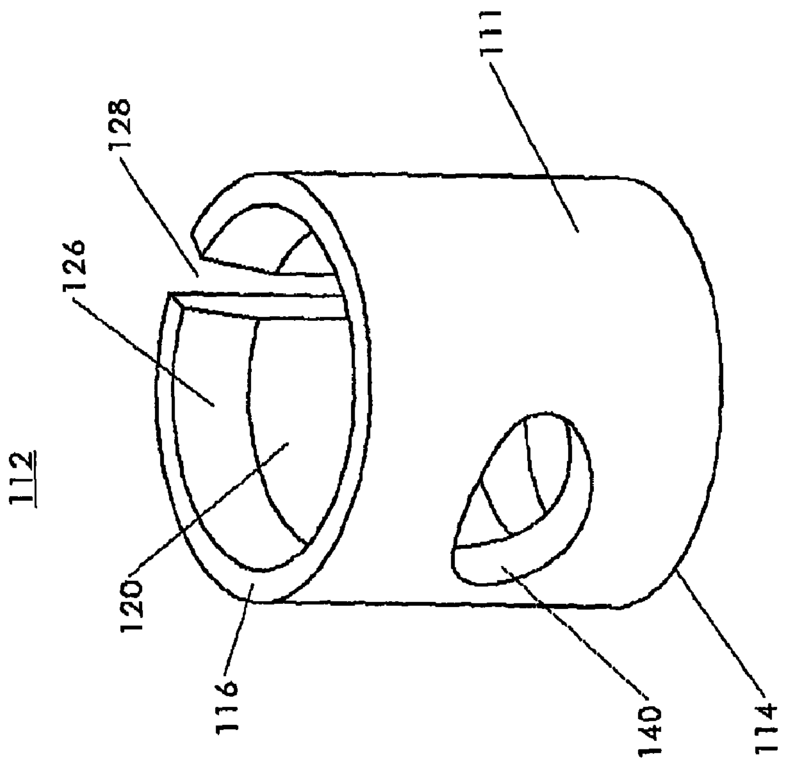
FIG. 9 is an alternative embodiment of the body of the terminal assembly.

Referring to FIG. 9, the body 12 of the terminal assembly 10 may include additional features to improve radial flexibility, reduce material requirements, and/or adjust the forces applied by and durability of the assembly. For example, in the alternative embodiment shown in FIG. 9, a modified body 112 is similar to the body 12 in that it is a hollow cylinder and includes a sidewall 111 which defines an open first end 114, and an open second end 116 opposed to the first end 114. The modified body 112 is split by an opening 128 that extends from the first end 114 to the second end 116, and the inner surface 120 of the body 112 includes tapered regions 124, 126 adjacent to each of the first and second ends 114, 116. In addition to these features, the modified body 112 also includes a second opening 140 formed in the sidewall 111 at a location spaced circumferentially from the opening 128. In the illustrated embodiment, the second opening is diametrically opposed to that of the opening 128. The second opening 128 extends through the thickness of the sidewall 111, and is spaced apart from both the first and second ends 114, 116. For example, opening 140 may be circular in shape, although it is not limited thereto.

Figure 10:
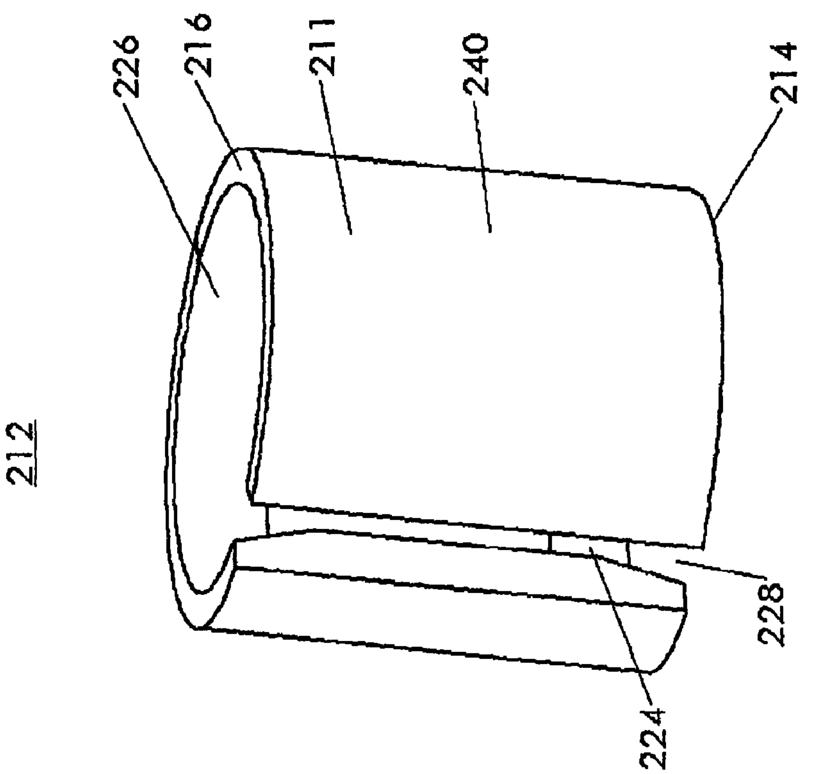
FIG. 10 is a second alternative embodiment of the body of the terminal assembly.

Referring to FIG. 10, in a second alternative embodiment, a modified body 212 is similar to the body 12 in that it is a hollow cylinder and includes a sidewall 211 which defines an open first end 214, and an open second end 216 opposed to the first end 214. The modified body 212 is split by an opening 228 that extends from the first end 214 to the second end 216, and the inner surface 220 of the body 212 includes tapered regions 224, 226 adjacent to each of the first and second ends 214, 216. In addition to these features, the modified body 212 also includes a second opening 240 formed in the sidewall 211 at a location overlying a portion of the opening 228. The second opening 228 extends through the thickness of the sidewall 211, and is spaced apart from both the first and second ends 214, 216. For example, the opening 240 may be rectangular in shape and oriented so that its long sides extend circumferentially, although it is not limited thereto.

Figure 12:
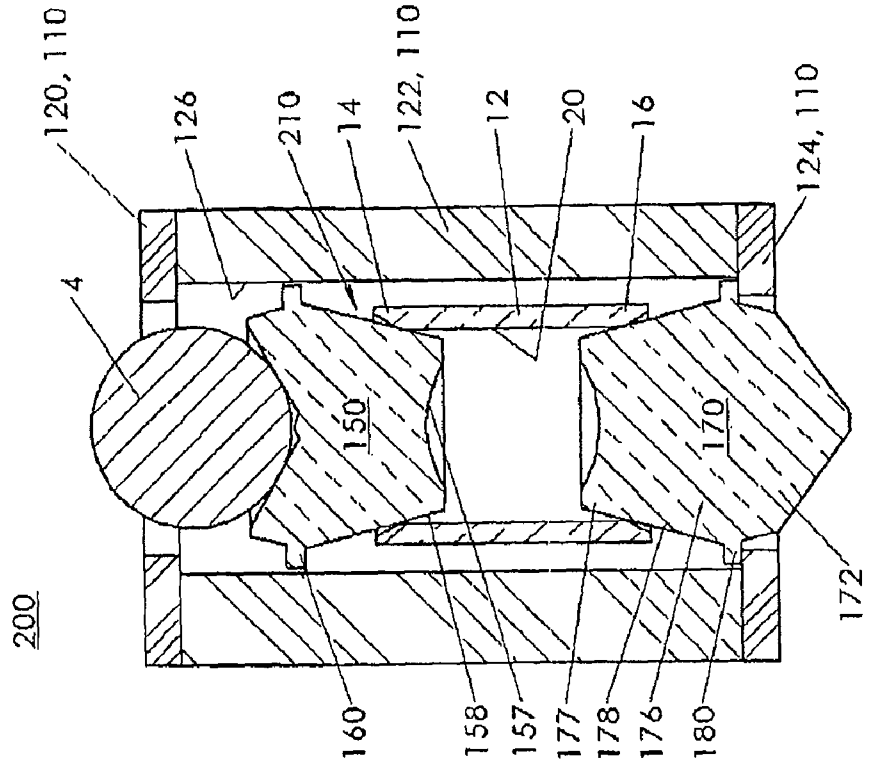
FIG. 12 is a sectional view of the connector assembly of FIG. 11 in a compressed state.
Figure 11:
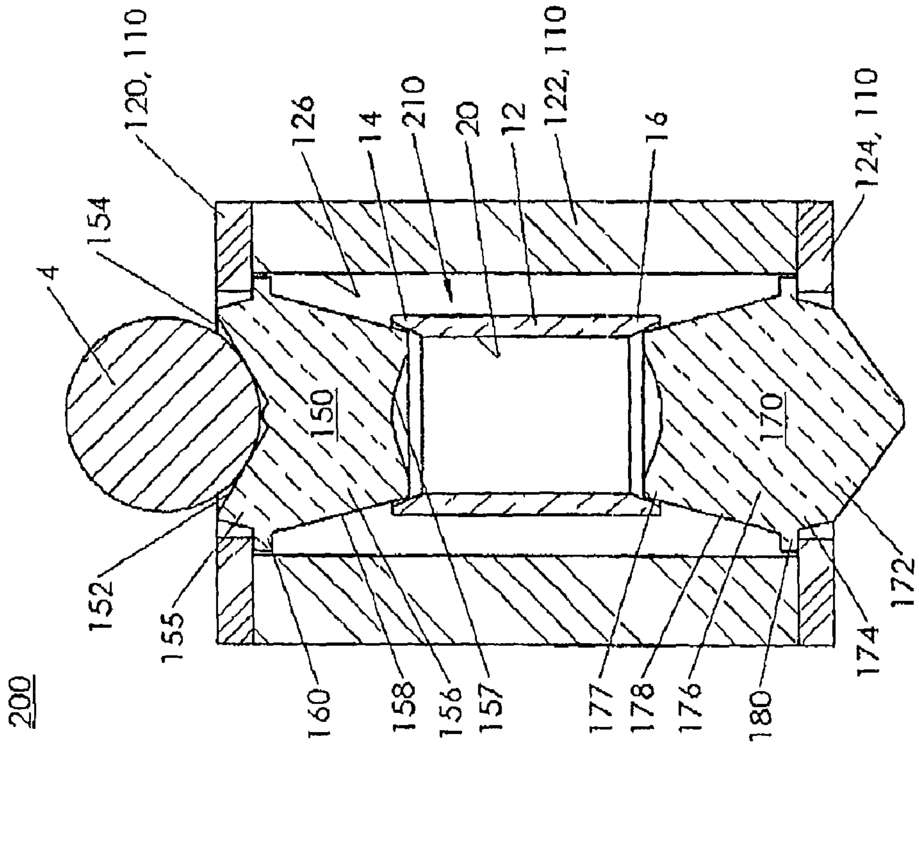
FIG. 11 is a sectional view of a connector assembly including another alternative embodiment of a terminal assembly in an uncompressed state.

Referring to FIGS. 11 and 12, an alternative embodiment terminal assembly 210 is shown. The terminal assembly 210 is similar to that of terminal assembly 10 and is used with the support member 110 to form a connector assembly 200. In particular, each terminal assembly 210 includes a resilient body 12 having a first terminal 150 disposed on the first end 14 of the body 12, and a second terminal 170 disposed on the second end 16. In the terminal assembly 210, the body 12 is identical to the body described above with respect to FIGS. 2-7. Although the first and second terminals 150, 170 differ in structure from terminals 50, 70, the over all function and operation of the terminal assembly 210 is like that of terminal assembly 10 except where discussed below. For example, in a manner similar to the embodiment shown in FIGS. 2-7, the first and second terminals 150, 170 are configured to be longitudinally movable relative to the respective body ends 14, 16, and the resiliency of the body 12 biases the first and second terminals 150, 170 in opposed directions along the longitudinal axis 18.

The first terminal 150 includes a cylindrical first portion 152 configured to electrically connect to a solder ball 4 of the BGA 2. In particular, an end 154 of the first portion 152 is concave in shape and dimensioned to receive and form an electrical connection with a solder ball 4 of the BGA 2.

The first terminal 150 also includes a tapered second portion 156 configured to electrically connect to the inner surface 20 of the body 12. The second portion 156 extends from a second end 155 of the first portion 152. The second portion 156 has a larger diameter than the first portion 152. In addition, a radially-outward protruding flange 160 is formed at the second end 155 of the first portion 152. The second portion 156 is tapered in the longitudinal direction so as to gradually decrease in diameter from the flange 160 to the end 157 of the second portion 156, providing a tapered region 158 on the first terminal 50.

The second terminal 170 includes a first portion 172 shaped and dimensioned to electrically connect to a contact pad 8 of the PCB 6. In the illustrated embodiment the first portion 172 is generally conical in shape.

The second terminal 170 also includes a tapered second portion 176 configured to electrically connect to the inner surface 20 of the body 12. The second portion 176 extends from one end 174 of the first portion 172. The second portion 176 has a larger diameter than the first portion 172, and a radially-outward protruding flange 180 is formed at the end 174 of the first portion 172. The second portion 176 is tapered in the longitudinal direction so as to gradually decrease in diameter from the flange 180 to the end 177 of the second portion 176, providing a tapered region 178 on the second terminal 170.

As seen in FIG. 11, the flanges 160, 180 of the respective terminals 150, 170 are dimensioned to be larger than the second aperture diameter da2 of the cover layers 120, 124, whereby the terminals 150, 170 are maintained within the aperture 126. In addition, as seen in FIG. 12, the flanges 160, 180 are dimensioned to limit the depth of insertion of the respective terminal 150, 170 into the body 12. For example, the diameter of the flanges 160, 180 is greater than the expanded outer diameter d7 of the body 12.

Figure 13:
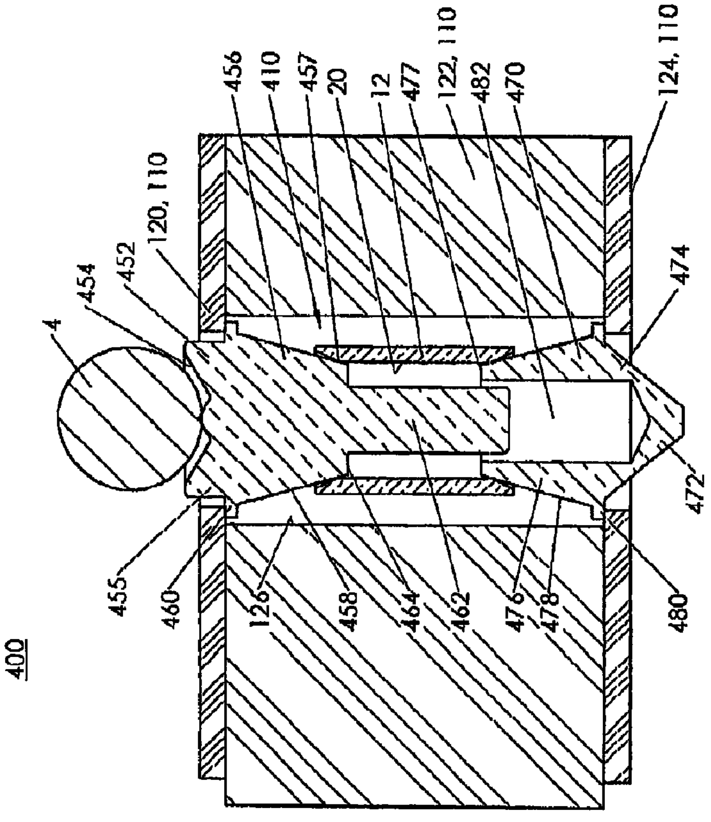
FIG. 13 is a sectional view of a connector assembly including another alternative embodiment of a terminal assembly in an uncompressed state.
Figure 14:
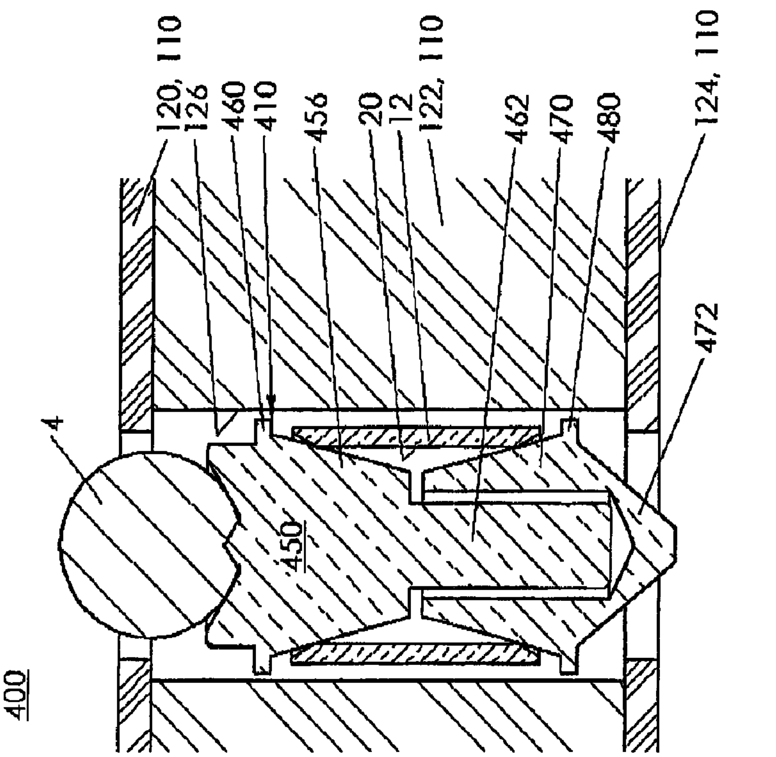
FIG. 14 is a sectional view of the connector assembly of FIG. 13 in a compressed state.

Referring to FIGS. 13 and 14, another alternative embodiment terminal assembly 410 is shown. The terminal assembly 410 is similar to that of terminal assembly 10 and is used with the support member 110 to form a connector assembly 400. In particular, each terminal assembly 410 includes a resilient body 12 having a first terminal 450 disposed on the first end 14 of the body 12, and a second terminal 470 disposed on the second end 16. In the terminal assembly 410, the body 12 is identical to the body described above with respect to FIGS. 2-7. Although the first and second terminals 450, 470 differ in structure from terminals 50, 70, the over all function and operation of the terminal assembly 410 is like that of terminal assembly 10 except where discussed below. For example, in a manner similar to the embodiment shown in FIGS. 2-7, the first and second terminals 450, 470 are configured to be longitudinally movable relative to the respective body ends 14, 16, and the resiliency of the body 12 biases the first and second terminals 450, 470 in opposed directions along the longitudinal axis 18.

The first terminal 450 includes a cylindrical first portion 452 configured to electrically connect to a solder ball 4 of the BGA 2. In particular, an end 454 of the first portion 452 is concave in shape and dimensioned to receive and form an electrical connection with a solder ball 4 of the BGA 2.

The first terminal 450 also includes a tapered second portion 456 configured to electrically connect to the inner surface 20 of the body 12. The second portion 456 extends from a second end 455 of the first portion 452. The second portion 456 has a larger diameter than the first portion 452. In addition, a radially-outward protruding flange 460 is formed at the second end 455 of the first portion 452. The second portion 456 is tapered in the longitudinal direction so as to gradually decrease in diameter from the flange 460 to the end 457 of the second portion 456, providing a tapered region 458 on the first terminal 450.

In addition, the first terminal 450 includes an elongated third portion, or pin, 462 that extends from the end 457 of the second portion. The pin 462 has an outer dimension that is less than that of the end 457, whereby a shoulder 464 is formed between the second and third portions 456, 462.

The second terminal 470 includes a first portion 472 shaped and dimensioned to electrically connect to a contact pad 8 of the PCB 6. In the illustrated embodiment the first portion 472 is generally conical in shape.

The second terminal 470 also includes a tapered second portion 476 configured to electrically connect to the inner surface 20 of the body 12. The second portion 476 extends from one end 474 of the first portion 472. The second portion 476 has a larger diameter than the first portion 472, and a radially-outward protruding flange 480 is formed at the end 474 of the first portion 472. The second portion 476 is tapered in the longitudinal direction so as to gradually decrease in diameter from the flange 480 to the end 477 of the second portion 176, providing a tapered region 478 on the second terminal 470.

In addition, the second terminal 470 includes a cavity, or socket, 482 that extends inward from the end 477. The socket 482 is dimensioned and shaped to receive the pin 462 of the first terminal 450 therein.

As seen in FIG. 13, the flanges 460, 480 of the respective terminals 450, 470 are dimensioned to be larger than the second aperture diameter da2 of the cover layers 120, 124, whereby the terminals 450, 470 are maintained within the aperture 126. In addition, the socket 482 of the second terminal 470 has a diameter that is less than that of the shoulder 464 of the first terminal 450, whereby the depth of insertion of the pin 462 into the socket 482 is limited.

As seen in FIG. 14, the flanges 460, 480 are dimensioned to limit the depth of insertion of the respective terminal 450, 470 into the body 12. For example, the diameter of the flanges 460, 480 is greater than the expanded outer diameter d7 of the body 12.

In the terminal assembly 410, the third portion 462 of the terminal 450 serves as an alignment pin, and is received within the socket 482 of the terminal 470. In particular, the pin portion 462 cooperatively engages the socket 482 to ensure that the respective terminals 450, 470 come together, and to maintain vertical alignment of the respective terminals 450, 470. In addition, because the terminal assembly 410 employs these features, the terminal assembly 410 has a very low profile. For example, in some embodiments, the terminal assembly 410 is dimensioned to provide an overall compressed height of about 0.027 inches for a pitch (i.e., spacing between apertures) of 0.5 mm. This can be compared to spacing in the uncompressed configuration of about 0.037 inches.

Figure 15:
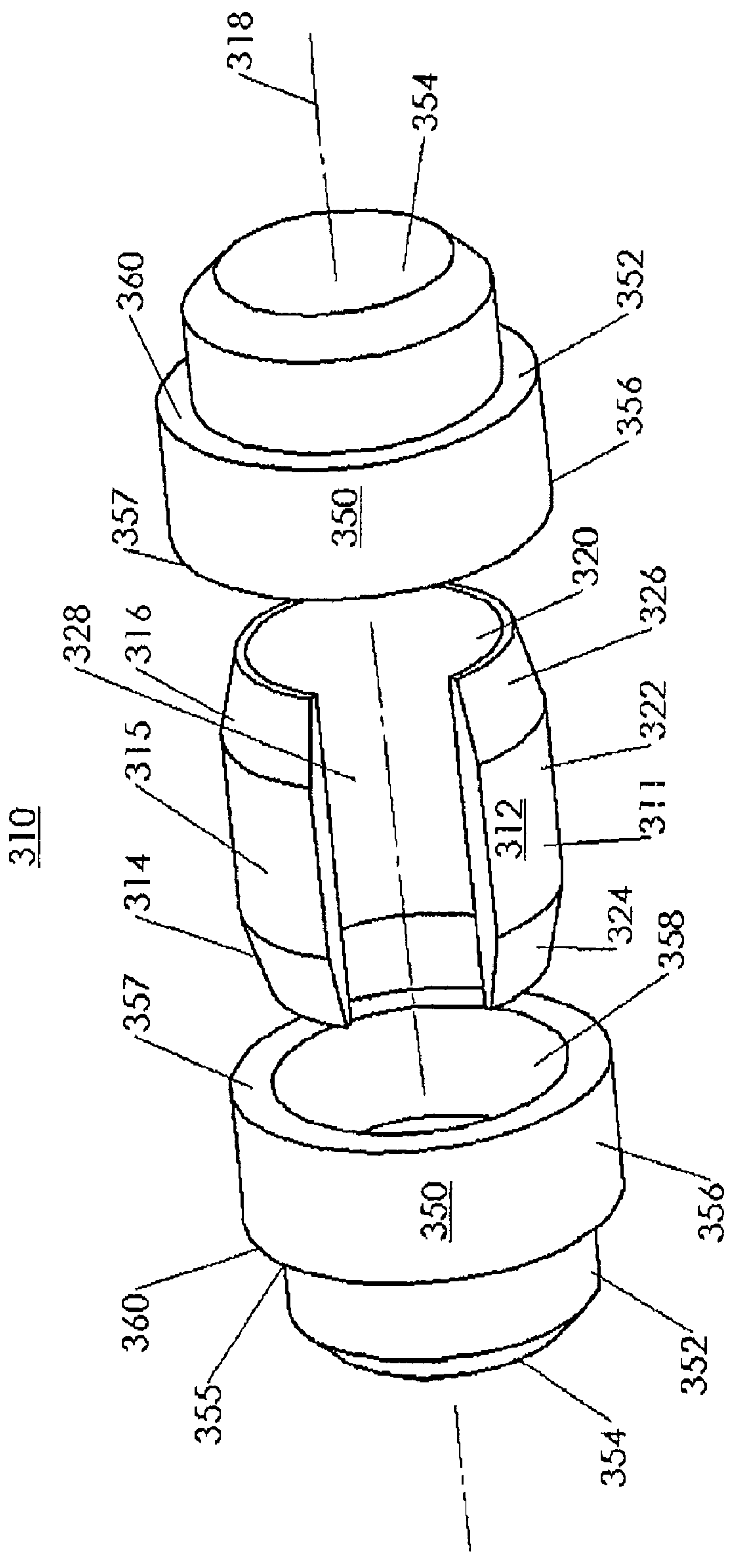
FIG. 15 is an exploded view of another alternative embodiment of a terminal assembly.

Referring to FIG. 15, another alternative embodiment terminal assembly 310 includes a resilient body 312 having a first terminal 350 disposed on the first end 314, and a second terminal 350 disposed on the second end 316. The first and second terminals 350, 350 are configured to be longitudinally movable relative to the respective ends 314, 316, as discussed further below. In addition, the resiliency of the body 312 biases the first and second terminals 350, 370 in opposed directions along the longitudinal axis 318.

Figure 16:
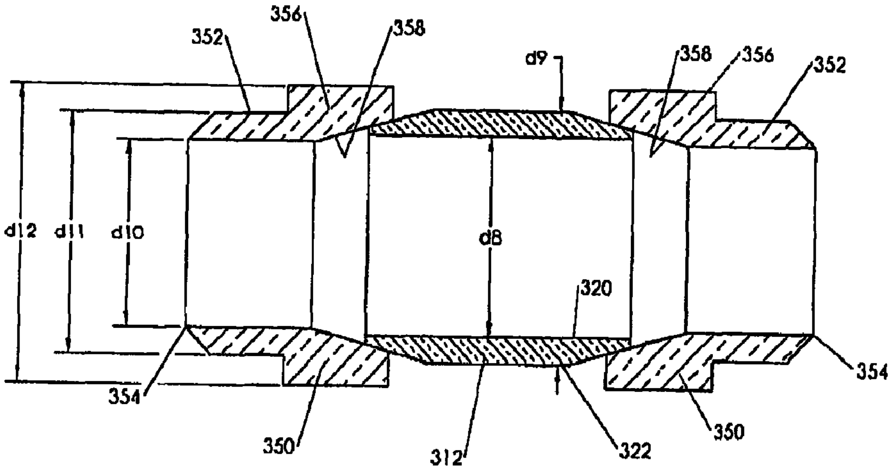
FIG. 16 is a side sectional view of the terminal assembly of FIG. 15.
Figure 19:
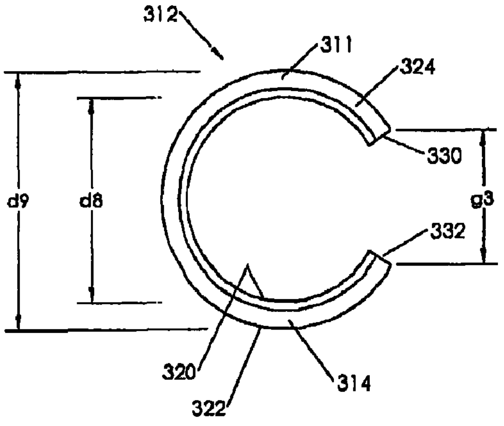
FIG. 19 is an end view of the body of terminal of FIG. 15 in an uncompressed state.
Figure 20:
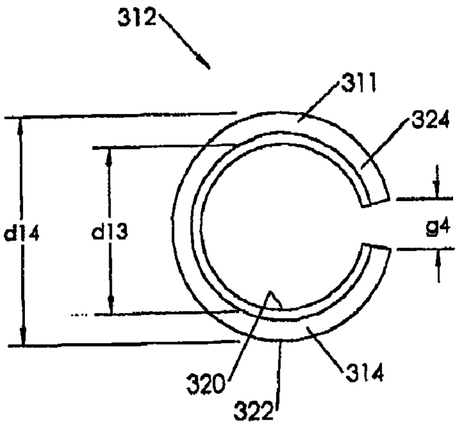
FIG. 20 is an end view of the body of terminal of FIG. 15 in a compressed state.

Referring also to FIGS. 16 and 19, the body 312 is a hollow cylinder and includes a sidewall 311 which defines an open first end 314, and an open second end 316 opposed to the first end 314. The body 312 is split by an opening 328 that extends from the first end 314 to the second end 16 such that the body 312 has a C-shaped cross section as viewed in a direction along the longitudinal axis 318. The opening 328 extends through the thickness of the sidewall 311 from an inner surface 320 to an outer surface 322 of the body 312, and permits the body 312 to radially expand or contract when in certain loading conditions, as discussed further below. The opening 328 defines a gap g3 in the sidewall 311 which separates opposed edges 330, 332 of the opening 328.

The inner surface 320 of the body 312 has a uniform diameter d8. In addition, the outer surface 322 of the body 312 is tapered adjacent to each of the first and second ends 314, 316 so that the thickness of the sidewall 311 decreases in the tapered regions 324, 326 adjacent the first and second ends 314, 316 relative to the sidewall thickness in a mid portion 315 of the body 312. For example, the outer surface 322 of the body 312 may be angled in the tapered regions 324, 326 so as to taper toward the inner surface 320. In an uncompressed state, the body 312 has an outer diameter d9 at the mid portion 315, for example in the region between tapered regions 324, 326. In the tapered regions 324, 326, the diameter tapers inward from the outer diameter d9 to a diameter having a value greater than d8.

The first and second terminals 350 include a hollow cylindrical body having first and second portions 352, 356. The first portion 352 is configured to electrically connect to a solder ball 4 of the BGA 2. In particular, an end 354 of the first portion 352 is open and dimensioned to receive a portion of a solder ball 4 therewithin. The second portion 356 is configured to electrically connect to the outer surface 322 of the body 312. The second portion 356 extends from a second end 355 of the first portion 352. The second portion 356 has a larger diameter than the first portion 352, whereby a shoulder 360 is formed at the second end 355 of the first portion 352. In addition, the second portion 356 is tapered in the longitudinal direction so as to gradually increase in diameter from the shoulder 360 to the end 357 of the second portion 356, providing a tapered region 358 on the terminal 350. The tapered region 358 has a minimum diameter d10, and a maximum diameter d11 at a location corresponding to end 357. The outer diameter of the cylindrical first portion 352 of the first terminal 350 is substantially the same as the maximum diameter d11 of the tapered region 358, and the outer diameter of the cylindrical second portion 356 is referred to as d12.

When the terminal assembly 310 is assembled, the first end 314 of the body 312 is at least partially received within the open end 357 of the corresponding terminal 350. In particular, the end 314 of the body 312 is received within the open end 357 such that at least a portion of the tapered region 324 of the first end 314 contacts the tapered region 358 of the terminal 350. Similarly, the second end 316 of the body 312 is at least partially received within the open end of other terminal 350 such that at least a portion of the tapered region 326 of the second end 316 contacts the tapered region 358 of the other terminal 350. The terminals 350 form an electrical connection with the body 312 via the contact between the respective tapered regions.

In the uncompressed state, the maximum diameter d11 of the second portion 356 of the terminal 350 is greater than the inner diameter d8 of the body 312, and less than the outer diameter d9 of the body 312. In addition, the minimum diameter d10 of the second portion 356 is less than both the inner diameter d8 and the outer diameter d9 of the body 312.

Figure 17:
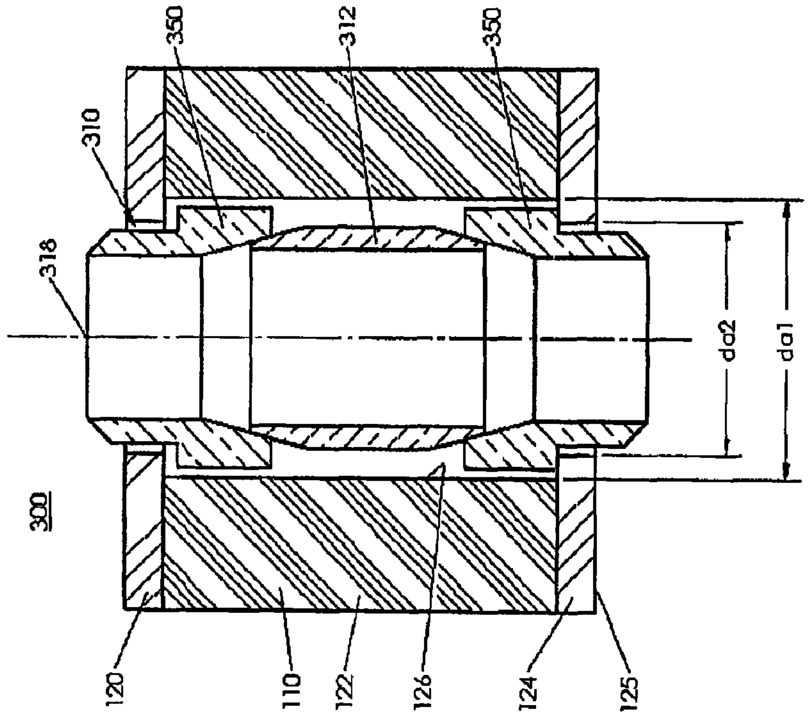
FIG. 17 is a sectional view of a connector assembly including the terminal assembly of FIG. 15 in an uncompressed state.

Referring to FIG. 17, the terminal assemblies 310 are received within the apertures 126 of the insulative support member 110 to form the connector assembly 300. The aperture 126 has a first aperture diameter da1 in the mid layer 122 that is greater than both the outer diameter d9 of the body 312, and the maximum diameter d12 of the second portion 356 of the respective terminals 350. The aperture 126 has a second aperture diameter da2 in each of the cover layers 120, 124 that is smaller than that of the first aperture diameter da1. In addition, the second aperture diameter da2 is greater than the outer diameter d11 of the first portion 352 and less than the maximum diameter d12 of the second portion 356 of the respective terminals 350. This configuration serves to retain the terminal assemblies 310 within the support member 110, while permitting the first portions 352 to protrude through the cover layers 120, 124. Here, it is understood that the terminal assembly 310 is floating within the aperture 126, and the connection between terminals 350 and the body 312 is maintained by appropriately limiting the thickness of the mid layer 122.

Figure 18:
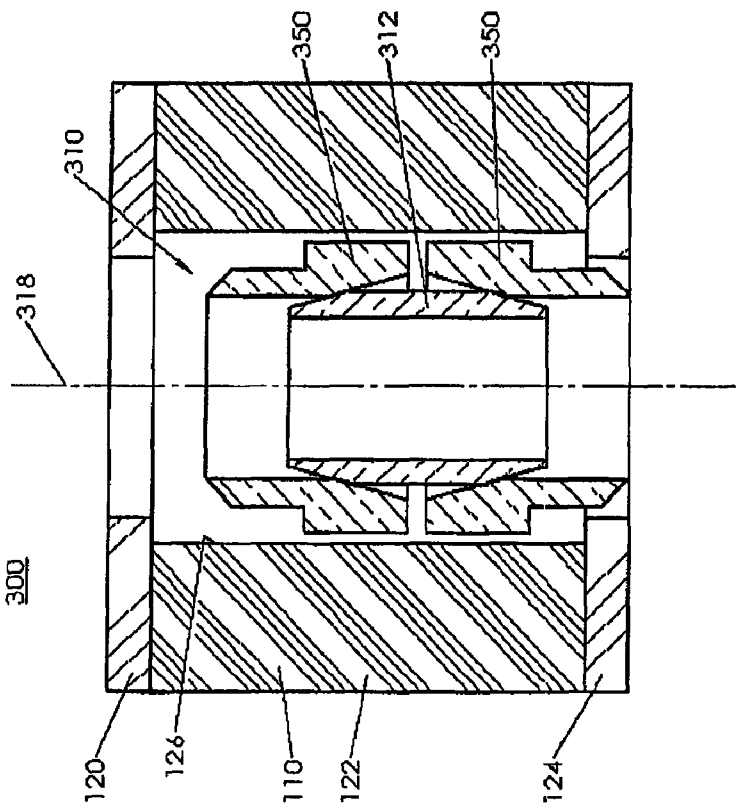
FIG. 18 is a sectional view of the connector assembly of FIG. 17 in a compressed state.

Referring now to FIG. 18, when the terminal 310 is subjected to axial compression, such as when the support member 110 is used to intercouple a first BGA integrated circuit package (not shown) to second BGA integrated circuit package (not shown), the proximity of the packages is sufficient to drive the both terminals 350 inward into the aperture 126. Under these conditions, the body 312 resiliently radially contracts since the terminals 350 are moved toward each other along the longitudinal axis 318. In particular, the tapered regions 358 of each terminal 350 slides inward along the respective tapered region 324, 326 formed on the ends 314, 316 of the body 312. As the terminals 350 move inward, each tapered region 358 acts as a wedge to radially contract the body 312. In particular, the radial contraction of the body 312 is achieved due to the presence of the opening 328 in the sidewall 311. For example, with reference to FIG. 16, in the compressed configuration, the body 312 has an inner diameter d13 and outer diameter d14 which are less than the corresponding diameters d8, d9 in the uncompressed state. In addition, in the compressed configuration, the opening 328 defines a gap g4 in the sidewall 311 which is smaller than the gap g2 of the uncompressed state.

The terminals 350 continue to form an electrical connection with the body 312 via the contact between the respective tapered regions 358 and 324, 326 regardless of the longitudinal position of the terminals 350 with respect to the body 312. In the compressed configuration, the body 312 is substantially enclosed within the interior space of the respective terminals 350. In addition, the outer diameter d12 of the terminals 350 is less than that of the first aperture diameter da1 within the mid layer 122. Also, the second aperture diameter da2 corresponding to the cover layer 120 is greater than that of the solder ball 4, and in the compressed configuration at least a portion of the solder ball 4 may be disposed within the aperture 126 (not shown).

When the terminal assembly 310 is in an uncompressed configuration, the gap g3 must have a dimension which is non-zero in order to allow contraction of the body 312 during compression.

Selected illustrative embodiments of the invention are described above in some detail. It should be understood that only structures considered necessary for clarifying the present invention have been described herein. Other conventional structures, and those of ancillary and auxiliary components of the system, are assumed to be known and understood by those skilled in the art.

In the illustrated embodiment, the terminals are very low profile in height (0.030 inches or less). However, it is within the scope of the invention to vary the proportions and/or dimensions of the terminal assembly and its component parts, as well as the pitch, depending on the requirements of the specific application.

In the illustrated embodiment, the terminals 50, 70 include portions which are the same size and shape. Such a configuration provides a terminal assembly 10 which moves and/or generates forces symmetrically. However, the assemblies are not limited to this, and the size and shape of one or both terminals may be altered to allow one terminal to move at a different rate, generate different forces and/or provide different electrical behavior than the other.

In the illustrated embodiment, the support member 110 includes three insulative layers 120, 122, 124. However, the disclosed number of layers is non-limiting, and it is understood that fewer or greater numbers of layers could be provided, depending on the requirements of the specific application.

In the illustrated embodiments, the terminals of the connector assemblies disclosed herein are formed of all-metal components. This is advantageous since metal terminals are robust and durable, and are easily plated or coated. However, the terminals are not limited to this material, and can be formed of electrically conductive elastomers or metalized plastics, depending on the requirements of the specific application.

Moreover, while working examples of the present invention have been described above, the present invention is not limited to the working examples described above, but various design alterations may be carried out without departing from the present invention as set forth in the claims.

What is claimed, is:

1. A terminal assembly comprising:

a hollow cylindrical body, the body including a first end, a second end opposed to the first end, and a longitudinal axis, the body configured to be radially resilient;

a first terminal disposed on the first end of the body and configured to be longitudinally movable relative to the first end; and a second terminal disposed on the second end of the body and configured to be longitudinally movable relative to the second end, wherein the resiliency of the body biases the first and second terminals in opposed directions along the longitudinal axis.

2. The terminal assembly of claim 1 wherein the body includes an opening that extends from the first end to the second end.

3. The terminal assembly of claim 2 wherein the body is received within each of the first and second terminals such that sidewalls of the body contact an interior surface of each of the first and second terminals.

4. The terminal assembly of claim 2 wherein the body includes a tapered edge at the intersection of the exterior surface of the body and each of the first and second ends, and each of the first and second terminals include a tapered portion configured to mate with the corresponding tapered edge of the body, whereby the first and second terminal are axially slidable relative to the body along the respective tapered mating surfaces.

5. The terminal assembly of claim 2 wherein each of the first and second terminals include a first portion configured to contact an electrical connection region of a substrate, and a second portion extending from the first portion and having an increasing inner diameter.

6. The terminal assembly of claim 2 wherein each of the first and second terminals include a hollow cylindrical body.

7. The terminal assembly of claim 1 wherein the body includes a sidewall having a thickness which decreases adjacent to each of the first and second ends.

8. The terminal assembly of claim 1 further comprising a first operating configuration in which the body has a first body diameter and a second operating configuration in which the body has a second body diameter, wherein the second body diameter is greater than the first body diameter.

9. The terminal assembly of claim 1 wherein the body, the first terminal and the second terminal include an electrically conductive material.

10. The terminal assembly of claim 1 wherein the first and second terminals are received within the body such that sidewalls of the first and second terminals have an electrical connection with an interior surface of the body.

11. The terminal assembly of claim 1 wherein the body includes a tapered edge at an intersection of an interior surface of the body and each of the first and second ends, and each of the first and second terminals include a tapered portion configured to mate with the corresponding tapered edge of the body, whereby the first and second terminal are axially slidable relative to the body along the respective tapered mating surfaces.

12. The terminal assembly of claim 1 wherein the first and second terminals are configured to be mutually aligning.

13. The terminal assembly of claim 1 wherein each of the first and second terminals include a first portion configured to contact an electrical connection region of a substrate, and a second portion extending from the first portion and having a decreasing outer diameter.

14. The terminal assembly of claim 13 wherein a third portion extends from the second portion of the first terminal, and the second portion of the second terminal includes a cavity, and the third portion of the first terminal is configured to be received in the cavity of the second terminal, whereby the first terminal is aligned with the second terminal.

15. The terminal assembly of claim 1 wherein the body includes an opening that extends longitudinally from the first end to the second end, the opening further extending radially between an interior surface and an exterior surface of the body.

16. The terminal assembly of claim 1 further comprising a first operating configuration in which a first end of the body has a first body diameter and a second operating configuration in which the first end of the body has a second body diameter, wherein the second body diameter is greater than the first body diameter.

17. A terminal assembly comprising:

a hollow cylindrical body, the body including a first end, a second end opposed to the first end, and a longitudinal axis, the body configured to be radially resilient;

a first terminal disposed on the first end of the body and configured to be longitudinally movable relative to the first end; and a second terminal disposed on the second end of the body and configured to be longitudinally movable relative to the second end, wherein the resiliency of the body biases the first and second terminals in opposed directions along the longitudinal axis, and the body has a C-shaped cross section as viewed in a direction along the longitudinal axis.

* * * * *